(12) United States Patent
Okutoh et al.

(10) Patent No.: US 6,576,942 B2
(45) Date of Patent: Jun. 10, 2003

(54) DIFFUSION PREVENTION FILM AND A SEMICONDUCTOR STORAGE DEVICE

(75) Inventors: Akira Okutoh, Kobe (JP); Kazuya Ishihara, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/179,245

(22) Filed: Jun. 26, 2002

(65) Prior Publication Data

US 2003/0001177 A1 Jan. 2, 2003

(30) Foreign Application Priority Data

Jun. 27, 2001 (JP) .......................................... 2001-194711

(51) Int. Cl.[7] .............................................. H01L 29/76
(52) U.S. Cl. ....................... 257/295; 257/296; 257/298; 257/301; 438/3; 438/238
(58) Field of Search ................................. 257/295, 296, 257/301, 298; 438/3, 238

(56) References Cited

U.S. PATENT DOCUMENTS

| | | | |
|---|---|---|---|
| 3,947,280 A | * | 3/1976 | Nemeth ....................... 501/153 |
| 5,638,319 A | | 6/1997 | Onishi et al. |
| 5,790,367 A | * | 8/1998 | Mateika et al. .......... 361/321.4 |
| 6,074,970 A | * | 6/2000 | Yamashita et al. ........... 501/138 |
| 6,087,288 A | * | 7/2000 | Masumura et al. .......... 501/138 |
| 6,137,672 A | * | 10/2000 | Mizuno et al. .......... 361/321.4 |
| 6,433,993 B1 | * | 8/2002 | Hunt et al. .................. 361/303 |
| 6,475,607 B2 | * | 11/2002 | Ueda et al. .................. 428/210 |

FOREIGN PATENT DOCUMENTS

JP          8-335673          12/1996

* cited by examiner

Primary Examiner—Tom Thomas
Assistant Examiner—Junghwa Im
(74) Attorney, Agent, or Firm—Nixon & Vanderhye, P.C.

(57) ABSTRACT

By depositing a diffusion prevention film 7 constructed of an oxide of aluminum containing barium and heat-treating the diffusion prevention film 7 in the atmosphere of a mixed gas of oxygen and carbon dioxide, carbon dioxide is made to adsorb to the barium contained in the diffusion prevention film 7. The diffusion prevention film can effectively restrain the permeation of hydrogen and has an excellent hydrogen barrier property. By using the diffusion prevention film for a capacitor, a high-yield semiconductor storage device having the capacitor of a stable ferroelectric characteristic or high dielectric characteristic can be obtained.

3 Claims, 2 Drawing Sheets

DIFFUSION PREVENTION FILM AND A SEMICONDUCTOR STORAGE DEVICE

BACKGROUND OF THE INVENTION

This invention relates to a diffusion prevention film and fabricating method therefor and relates further to a semiconductor storage device that employs a ferroelectric film or a high dielectric film for the dielectric layer of a capacitor for charge storage use and fabricating method therefor.

The conventional nonvolatile memory devices of EPROM (Erasable Programmable Read Only Memory), EEPROM (Electrically Erasable Programmable Read Only Memory) and flash memory, which have a read time equivalent to that of DRAM (Dynamic Random Access Memory), are however not expected to operate at high speed since the write time thereof is long. In contrast to this, the ferroelectric memory, which is a nonvolatile memory that employs a ferroelectric capacitor as a charge storage section, is a randomly accessible nonvolatile memory that has a read time and a write time equivalent to those of DRAM and is able to have high speed operation expected.

Accordingly, there is the possibility of replacing these memories with sole ferroelectric memory in a system of a combination of the conventional nonvolatile memory of flash memory and DRAM used as a work memory.

Moreover, there can be considered a memory of a form like MFS (metal-ferroelectric-semiconductor) or MFIS (metal-ferroelectric-insulator-semiconductor) in which the gate electrode of a transistor is replaced by a ferroelectric. However, the device structure of the general ferroelectric memory, which starts being widely put into practical use at present, is one memory cell constructed of one ferroelectric capacitor and one select transistor.

As the material of the ferroelectric film used for the ferroelectric capacitor, which is the charge storage section of the ferroelectric memory, attention has been paid to $PbZr_xTi_{1-x}O_3$ (PZT: lead zirconate titanate) that has been thoroughly examined up to now, $SrBi_2Ta_2O_9$ (SBT: Strontium Bismuth Tantalate) that has a fatigue resistance characteristic in comparison with PZT and is able to operate on a low voltage, $Bi_4Ti_3O_{12}$ (BIT) and so on, which are currently being energetically examined.

The forming methods of the above-mentioned ferroelectric film include the MOD (Metal Organic Deposition) method, the sol-gel method, the MOCVD (Metal Organic Chemical Vapor Deposition) method, the sputtering method and so on. According to any of the film forming methods, the ferroelectric film, which is an oxide, is therefore required to be crystallized by heat treatment in an oxidative atmosphere at an elevated temperature of about 600° C. to 800° C. On the other hand, since the electrode material of the ferroelectric capacitor is required to have heat resistance in the high-temperature oxidative atmosphere for crystallizing the ferroelectric, there are widely used platinum that has oxidation resistance, iridium that exhibits electrical conductivity despite its being an oxide, and so on for the upper electrode and the lower electrode.

When the ferroelectric capacitor is formed by using the above-mentioned electrode material and dielectric material, there is the practice of successively depositing a lower electrode layer, a ferroelectric layer and an upper electrode layer and thereafter processing the layers into a tiered form by the dry etching method.

In the above-mentioned ferroelectric memory, the ferroelectric film is the oxide, the ferroelectric film is disadvantageously reduced if the film undergoes a heat treatment process in a reductive atmosphere through a device forming process subsequent to the heat treatment process for crystallizing the ferroelectric film, and this disadvantageously causes bad influence such as the increase in the leak current of the ferroelectric film and the disappearance of ferroelectricity itself. Therefore, according to the structure disclosed in Japanese Patent Laid-Open Publication No. HEI 8-335673, a diffusion prevention film is deposited just on the capacitor so as to cover the entire capacitor. The diffusion prevention film of this structure is used for preventing the structure of the direct contact of the ferroelectric with the layer insulation film. The adoption of this structure can expect the effect of enabling the prevention of diffusion of hydrogen, which becomes a reducing agent, to the ferroelectric capacitor. Therefore, after the deposition of the diffusion prevention film made of alumina (aluminum oxide) for the purpose of providing a hydrogen barrier just on the ferroelectric capacitor, the layer insulation film is deposited.

Although the ferroelectric memory, which employs the ferroelectric film in the charge storage section, has been described hereinabove, a similar situation occurs in the case of a high-integration DRAM that employs a high dielectric film in the charge storage section. That is, the high dielectric film of DRAM is also an oxide similar to the ferroelectric film. If the film undergoes a heat treatment process in a reductive atmosphere in the device forming process after the formation of the high dielectric film, then the high dielectric film is disadvantageously reduced. This causes an increase in leak current of the high dielectric film and a reduction in dielectric constant, disadvantageously causing bad influences such that the sufficient electric charges for making the memory function cannot be maintained. Therefore, for the purpose of protecting the charge storage section from hydrogen that becomes a reducing agent, a diffusion prevention film of alumina is deposited just on the capacitor.

The problem intended to be solved by this invention is the hydrogen barrier property of alumina, which is the diffusion prevention film of the ferroelectric memory and DRAM that employs the high dielectric film. In the ferroelectric memory and the DRAM that employs the high dielectric film, a process using hydrogen is carried out in a device forming process after the formation of a capacitor, and a film that contains hydrogen is employed for the layer insulation film. Therefore, hydrogen diffuses into the capacitor section and unfortunately partially reduces the ferroelectric film and the high dielectric film of the oxide. Otherwise, when a film that contains a large amount of moisture in the layer insulation film is employed, the hydrogen generated through the reaction of the moisture that has desorbed from the layer insulation film with the metallic layer diffuses only by being maintained at an elevated temperature even in the process that does not directly use hydrogen and disadvantageously reduces the dielectric layer of the capacitor, which is the oxide, in a similar way. Consequently, there are caused the degradation and the like of the capacitor characteristics, such as an increase in leak current, a reduction in dielectric constant and the deterioration of the hysteresis loop in the case of the ferroelectric.

Although the amount of permeative hydrogen can be reduced to some degree by devising the hydrogen barrier film producing method and the like, the hydrogen cannot completely be barriered. In particular, alumina, which is the diffusion prevention film, cannot sufficiently maintain the hydrogen barrier property at an elevated temperature of not lower than 400° C. Since the film is required to undergo a process that uses a temperature zone up to 450° C. also at least after the formation of metallic aluminum interconnection, hydrogen is required to be stably barriered also in the temperature zone at this level. However, since hydrogen is practically made to abruptly permeate at and above a temperature of about 300° C. to 400° C., the forming process after the capacitor formation has restrictions of temperature and the high-temperature process time, which is required to be as short as possible. After undergoing a long-time process at an elevated temperature of not lower than 400° C. at the request of another fabricating process, the characteristics of the capacitor in which a ferroelectric film or a high dielectric film is employed for the dielectric layer varies or becomes unstable after the process, and this causes the problems of the occurrence of defective bits, characteristic degradation, malfunction of the memory operation itself and reduced yield.

SUMMARY OF THE INVENTION

Accordingly, an object of this invention is to provide a diffusion prevention film with an excellent hydrogen barrier property capable of effectively restraining the permeation of hydrogen and to provide a fabricating method therefor.

Another object of this invention is to provide a high-yield semiconductor storage device provided with a capacitor that has a stable ferroelectric property or high dielectric property with the above-mentioned diffusion prevention film and to provide a fabricating method therefor.

In order to achieve the above object, there is provided a diffusion prevention film comprised of an oxide of aluminum containing at least one kind of Group-II elements, wherein at least one of carbon dioxide and carbon monoxide adsorbs to said at least one kind of Group-II elements.

According to the diffusion prevention film of the above-mentioned construction, at least one of carbon dioxide and carbon monoxide adsorbs to the Group-II element contained in the oxide of aluminum, and minute grain boundaries of the oxide of aluminum are buried. Therefore, a diffusion prevention film with an excellent hydrogen barrier property capable of effectively restraining the permeation of hydrogen can be provided.

In one embodiment of the present invention, a principal constituent material of aluminum oxide contains at least one of barium and strontium.

According to the diffusion prevention film of the above-mentioned embodiment, by using aluminum oxide for the principal constituent material and adding at least one of barium and strontium to the aluminum oxide, carbon dioxide (or carbon monoxide) adsorbs to the barium or strontium segregated at the grain boundaries of the aluminum oxide, burying the minute grain boundaries of aluminum oxide. Therefore, the permeation of hydrogen is effectively restrained.

Also, there is provided a fabricating method of the diffusion prevention film of the present invention, comprising the steps of:

depositing the diffusion prevention film comprised of an oxide of aluminum containing at least one kind of Group-II elements; and heat-treating the diffusion prevention film in an atmosphere that contains at least one of carbon dioxide and carbon monoxide.

According to the above-mentioned diffusion prevention film fabricating method, by depositing a diffusion prevention film comprised of an oxide of aluminum that contains at least one kind of Group-II elements and thereafter heat-treating the deposited diffusion prevention film in the atmosphere that contains at least one of carbon dioxide and carbon monoxide, at least one of carbon dioxide and carbon monoxide adsorbs to at least one kind of the Group-II elements contained in the oxide of aluminum, burying the minute grain boundaries of the oxide of aluminum. Therefore, the permeation of hydrogen can effectively be restrained, and the hydrogen barrier property can remarkably be improved.

In one embodiment of the present invention, the process of heat-treating the diffusion prevention film is carried out in an atmosphere that contains oxygen and at least one of carbon dioxide and carbon monoxide.

According to the diffusion prevention film fabricating method of the above-mentioned embodiment, by not only adsorbing at least one of carbon dioxide and carbon monoxide to the Group-II element added to the oxide film of aluminum but also heat-treating the film in the atmosphere that contains oxygen, the oxide film of aluminum can sufficiently be oxidized to allow the defects to be reduced.

Also, there is provided a semiconductor storage device provided with a MOS transistor formed on a semiconductor substrate and a capacitor that employs a ferroelectric film or a high dielectric film for a dielectric layer, wherein the capacitor is covered with the diffusion prevention film of the present invention.

According to the semiconductor storage device of the above-mentioned construction, the permeation of hydrogen can effectively be restrained. By covering the capacitor with the diffusion prevention film that can remarkably improve the hydrogen barrier property, the characteristic deterioration of the ferroelectric film (or high dielectric film) due to the diffusion of the hydrogen used in the device forming process or the hydrogen generated through the reaction or the like can be restrained. Moreover, a capacitor that has a stable satisfactory ferroelectric property (or high dielectric property) can be obtained, and the occurrence of the defectiveness of the semiconductor storage device is reduced to allow the yield to be improved.

Also, there is provided a fabricating method of a semiconductor storage device provided with a MOS transistor formed on a semiconductor substrate and a capacitor that employs a ferroelectric film or a high dielectric film for a dielectric layer, comprising the steps of:

forming the MOS transistor on the semiconductor substrate;

forming a first layer insulation film on the semiconductor substrate on which the MOS transistor has been formed;

forming a capacitor that employs a ferroelectric film or a high dielectric film for a dielectric layer on the first layer insulation film;

depositing a diffusion prevention film comprised of an oxide of aluminum that contains at least one kind of Group-II elements so that the diffusion prevention film covers the capacitor; and heat-treating the diffusion prevention film in an atmosphere that contains at least one of carbon dioxide and carbon monoxide after the process of depositing the diffusion prevention film.

According to the above-mentioned semiconductor storage device fabricating method, the MOS transistor is formed on the semiconductor substrate, and the first layer insulation film is formed on the semiconductor substrate on which the MOS transistor has been formed. Then, the capacitor in which the high dielectric film or ferroelectric film is used for the dielectric layer is formed on the first layer insulation film, and the diffusion prevention film, which is constructed of the oxide of aluminum that contains at least one kind of Group-II elements, is deposited so as to cover the capacitor. Thereafter, the diffusion prevention film is heat-treated in the atmosphere that contains at least one of carbon dioxide and carbon monoxide. By so doing, at least one of carbon dioxide and carbon monoxide adsorbs to at least one kind of the Group-II elements contained in the oxide of aluminum, burying the minute grain boundaries of the oxide of aluminum. Therefore, the permeation of hydrogen can effectively be restrained, and the hydrogen barrier property can remarkably be improved. Moreover, a capacitor that has a stable satisfactory ferroelectric property (or high dielectric property) can be obtained, and the occurrence of the defectiveness of the semiconductor storage device is reduced to allow the yield to be improved.

In one embodiment of the present invention, the process of heat-treating the diffusion prevention film is carried out in the atmosphere that contains oxygen and at least one of carbon dioxide and carbon monoxide.

According to the semiconductor storage device fabricating method of the above-mentioned embodiment, by not only adsorbing at least one of carbon dioxide and carbon monoxide to the Group-II element added to the oxide film of aluminum but also heat-treating the film in the atmosphere that contains oxygen, the oxide film of aluminum can sufficiently be oxidized to allow the defects to be reduced.

In one embodiment of the present invention, the process of heat-treating the diffusion prevention film is carried out under a temperature condition of 500° C. to 800° C.

According to the semiconductor storage device fabricating method of the above-mentioned embodiment, the adsorption of carbon dioxide or carbon monoxide to the Group-II element contained in the oxide of aluminum that is the diffusion prevention film is not sufficient at a temperature lower than 500° C., and the hydrogen barrier property deteriorates at a temperature exceeding 800° C. Therefore, the process of heat-treating the diffusion prevention film should preferably be carried out under the temperature condition of 500° C. to 800° C.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
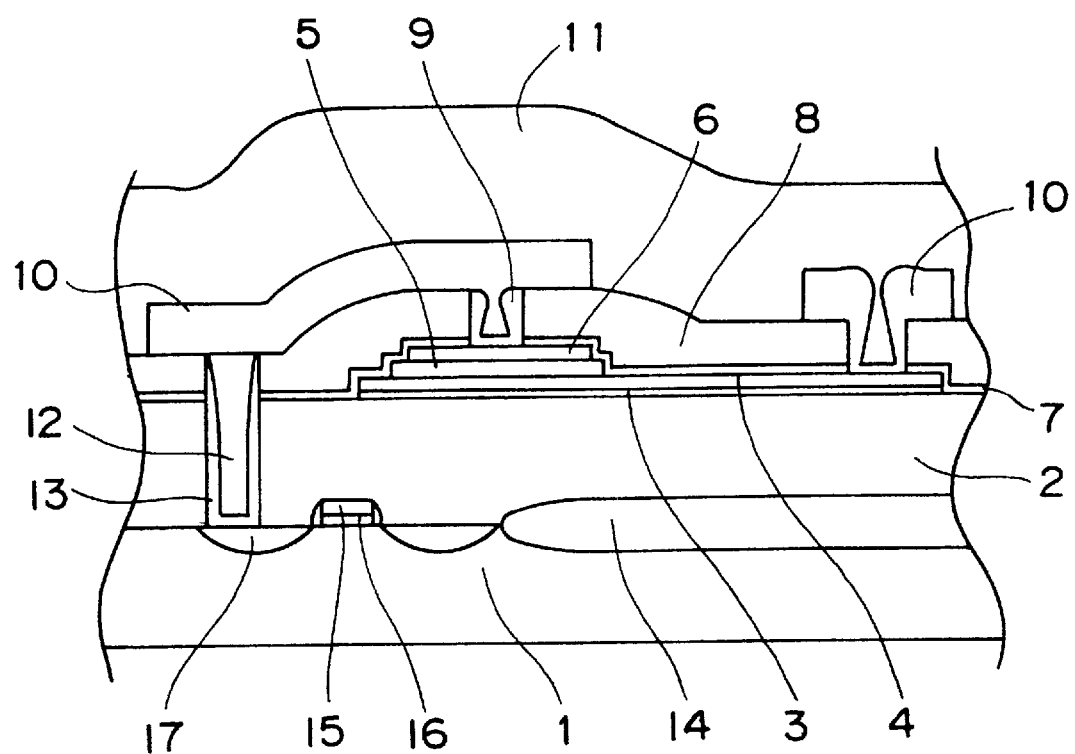
FIG. 1 is a structural sectional view of the essential part of a semiconductor storage device that employs a diffusion prevention film according to an embodiment of this invention.

The diffusion prevention film, the fabricating method therefor, the semiconductor storage device and the fabricating method therefor of this invention will be described in detail below on the basis of the embodiment shown in the drawings.

FIG. 1 is a sectional view of the essential part of the fabricating method of the semiconductor storage device that employs the diffusion prevention film of one embodiment of this invention. First of all, the outline of the structure of the semiconductor storage device (ferroelectric memory) that employs the ferroelectric capacitor of this embodiment will be described.

In FIG. 1, there are shown an N-type silicon substrate 1, a LOCOS oxide film 14 for element isolation formed on the surface of the silicon substrate 1, a gate electrode 15 formed on the silicon substrate 1, a gate oxide film 16 formed between the silicon substrate 1 and the gate electrode 15, a source/drain region 17 formed on the silicon substrate 1, a first layer insulation film 2 formed of a silicon oxide film on the silicon substrate 1, a titanium oxide film 3 for improving the adhesion of the first layer insulation film 2 to platinum, a lower electrode 4 formed of a platinum layer on the titanium oxide film 3, an SBT film 5 that is a ferroelectric thin film formed on the lower electrode 4, an upper electrode 6 formed of a platinum layer on the SBT film 5, a diffusion prevention film 7 made of aluminum oxide for preventing the diffusion of the element that constitutes the SBT film 5 and diffusion of hydrogen from the outside of the capacitor, a second layer insulation film 8 formed of a silicon oxide film on the diffusion prevention film 7, a titanium nitride film 9 formed on the upper electrode 6, an interconnection layer 10 constructed of titanium nitride, aluminum and titanium, a third layer insulation film 11 formed of a silicon oxide film on the interconnection layer 10, a tungsten plug 12 formed for making contact with the source/drain region 17, and a barrier layer 13 that has a TiN/Ti construction for restraining the reaction of the tungsten of the tungsten plug 12 with the silicon of the source/drain region 17.

Although the N-type silicon substrate 1 will be described in connection with this embodiment, this invention is not limited to this.

The fabricating process of the semiconductor storage device shown in FIG. 1 will be described next.

First of all, the LOCOS oxide film 14 having a film thickness of about 50 nm is formed on the surface of the silicon substrate 1 by a known method, and an element isolation region is formed. Next, a select transistor constructed of the gate electrode 15, the source/drain region 17 and so on is formed by a well-known technique, and thereafter, the first silicon dioxide film is formed to a film thickness of about 500 nm as the first layer insulation film 2 by the CVD (Chemical Vapor Deposition) method.

Next, a titanium film having a film thickness of 50 nm is formed on the first layer insulation film 2 by the DC magnetron sputtering method, and the titanium oxide film 3 is formed by heat-treating the film in oxygen for 30 minutes at a temperature of 600° C. Further, the lower electrode 4 is formed to a film thickness of 200 nm by the DC magnetron sputtering method.

Next, a MOD raw material solution of SBT (Strontium Bismuth Tantalate) is spin-coated on this lower electrode 4 by the MOD (Metal Organic Deposition) method at a rotating speed of 3000 rpm by means of a spinner, and the solvent is dried for five minutes at a temperature of 150° C. The first baking of the SBT film 5 is carried out in an oxygen atmosphere at atmospheric pressure for ten minutes at a temperature of 500° C., and thereafter, the second baking is carried out as a heat treatment for crystallization in the oxygen atmosphere for 10 minutes at a temperature of 750° C. by the RTA (Rapid Thermal Annealing) method. The processes from coating to the heat treatment for crystallization are repeated five times or six times so that the SBT film 5 of the desired film thickness of 250 nm is obtained. The SBT film forming method may be provided by the sol-gel method, the sputtering method, the MOCVD method and the like besides the MOD method. The upper electrode 6 is formed to a film thickness of 100 nm on this SBT film 5 by the DC magnetron sputtering method. Although the SBT is employed as a ferroelectric in this embodiment, an effect similar to that of this invention can be obtained also with PZT or another ferroelectric or high dielectric.

Next, patterning with a photoresist is carried out by the photolithographic technique, and the upper electrode 6 is processed to 1.2 μm square by the dry etching method. Likewise, the SBT film 5 is processed to 1.6 μm square, and the lower electrode 4 is processed into a linear shape of 2.2 μm.

Subsequently, a diffusion prevention film 7, which protects the SBT film 5 from reduction due to hydrogen, is formed to a thickness of 30 nm by the RF magnetron reactive sputtering method. The aluminum oxide of this diffusion prevention film 7 is deposited while introducing oxygen gas by the RF magnetron reactive sputtering method using a target that contains 1% by mole of barium oxide (BaO) in alumina ($Al_2O_3$).

Next, heat treatment is carried out in a mixed gas atmosphere that includes 50% of oxygen and 50% of carbon dioxide at a temperature of 650° C. This is to sufficiently oxidize the alumina film that is the diffusion prevention film 7 and to adsorb carbon dioxide to the barium mixed as an additive. It was confirmed that the added barium segregated at the grain boundaries inside the alumina film of the microcrystal body by a TEM (transmission electron microscope) image. It can be considered that the permeation of hydrogen is restrained by the burial of the minute grain boundaries of the alumina film constructed of the microcrystals that barely exist, although the greater part is amorphous, as a consequence of the adsorption of carbon dioxide to this barium.

For the sake of comparison, an alumina film, which contained no additive and had a film thickness identical to that of the diffusion prevention film of the above-mentioned embodiment, was formed. A diffusion prevention film heat-treated at a temperature of 600° C. in the oxygen atmosphere that did not contain carbon dioxide and a diffusion prevention film formed by the fabricating method of the above-mentioned embodiment were prepared, and experiments for examining the hydrogen barrier characteristics were carried out by the thermal desorption spectrometry (TDS) method.

Figure 2:
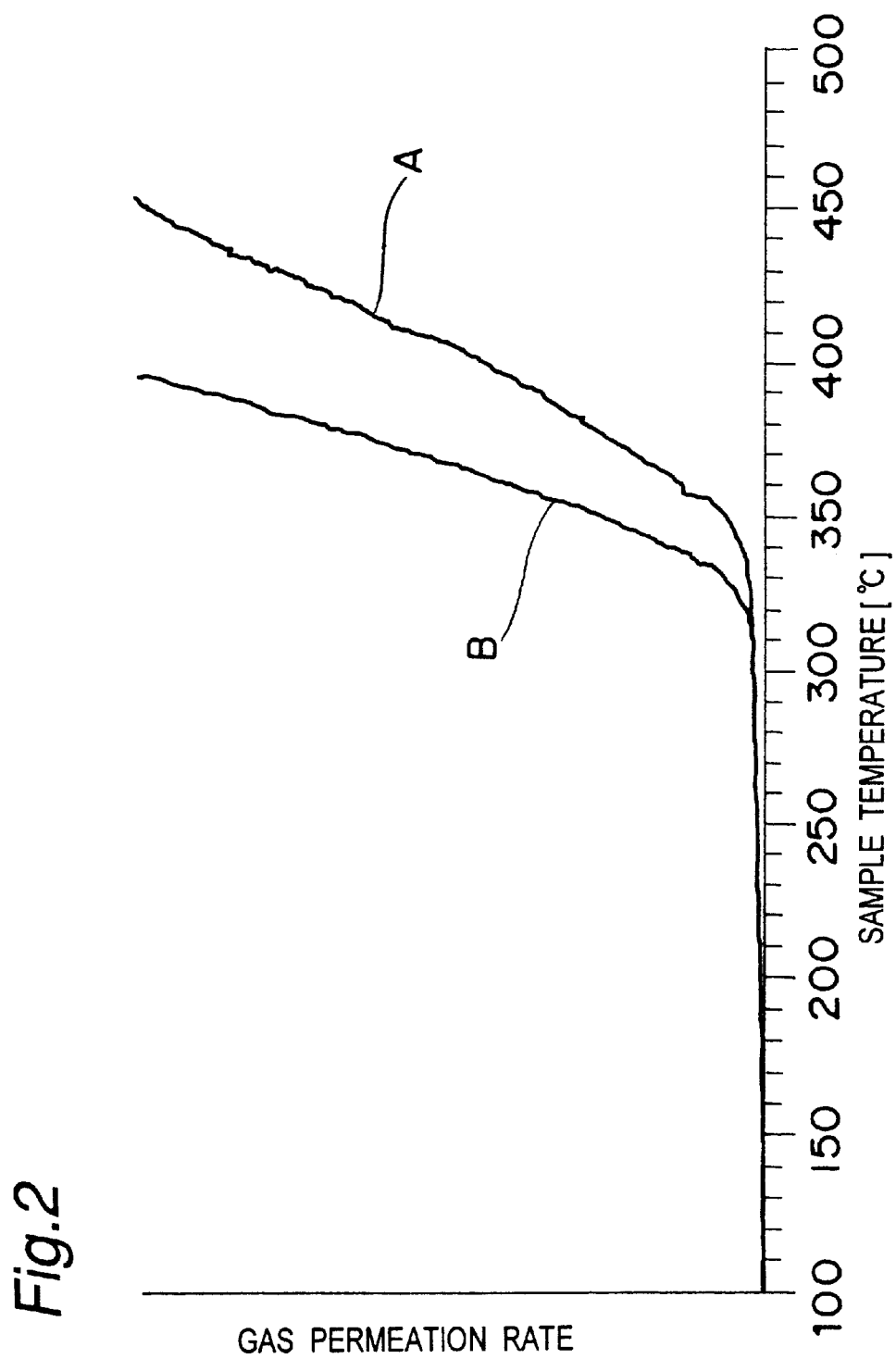
FIG. 2 is a graph in which the hydrogen permeability of the diffusion prevention film of the semiconductor storage device that employs the above ferroelectric capacitor is evaluated by the TDS method.

FIG. 2 shows the results of evaluating the permeation rate of gas of molecular weight of 2 using sample temperature as a parameter with regard to the hydrogen permeability of these diffusion prevention films by the TDS method. In FIG. 2, the horizontal axis represents the sample temperature, and the vertical axis represents the permeation rate (arbitrary scale). The reference letter A indicates the hydrogen permeability of the diffusion prevention film formed by the fabricating method of this embodiment, while the reference letter B indicates the hydrogen permeability of the diffusion prevention film heat-treated at a temperature of 600° C. in an oxygen atmosphere that does not contain carbon dioxide.

As shown in FIG. 2, no significant difference is observed in the hydrogen barrier characteristic up to a temperature of about 300° C., it can be understood that the diffusion prevention film formed by this embodiment obviously has a lower rate of permeation of hydrogen and has a superior hydrogen barrier characteristic at a temperature of not lower than about 315° C. For example, the rate of permeation of hydrogen at a temperature of 400° C. is half that of the conventional rate. This indicates that the time for post-processing can be more than doubled simply at the same temperature with the conventional permeation rate of hydrogen kept intact and that the amount of reduction due to hydrogen becomes half in an identical process.

Although the above-mentioned experiments have been carried out on the barium-added alumina, a similar effect is observed in the case of strontium and calcium. Strontium has the effect slightly inferior to that of barium. However, strontium, which is the constituent element of the ferroelectric film, exerts almost no influence on the ferroelectric layer also in the case of the diffusion of strontium itself when mixed in alumina by a trace quantity. Although carbon dioxide is used for heat treatment, a similar effect is observed even with carbon monoxide. With regard to the film forming method of alumina, which is the diffusion prevention film, alumina is formed by the sputtering method in this embodiment. However, any other film forming method can also be used.

Then, after the formation of the diffusion prevention film 7, the second layer insulation film 8 is formed by mixing tetraethoxysilane and ozone in a gaseous form, forming by thermal decomposition an ozone-TEOS film, which generates a silicon oxide film, to a film thickness of 500 nm and heat-treating the film at a temperature of 400° C. Subsequently, patterning with a photoresist is carried out by the photolithographic technique, and a contact hole of a diameter of 0.7 μm is formed on the upper electrode 6 of the capacitor by the dry etching method.

Next, the titanium nitride film 9 is deposited to a film thickness of 200 nm by the CVD method. By this CVD method, titanium tetrachloride is used as a raw material of titanium, and methylhydrazine or ammonia gas is used as a reducing gas. The Ti raw material is not limited to the above-mentioned material, and it is acceptable to use an organic metal material of tetrakis(dimethylamino)titanium or the like through bubbling. The titanium nitride film 9 is formed by heating the substrate temperature to 400° C., introducing the above-mentioned raw material onto the substrate and maintaining a reduced pressure of 1 to 5 Torr. Subsequently, the film is heat-treated for 30 seconds at a temperature of 550° C. by the RTA method. The atmosphere at the time has a nitrogen density of not less than 99% and an oxygen density of less than 1%. By this heat treatment, the grain boundaries of the titanium nitride film 9 are buried under titanium oxide formed as a consequence of the bonding of excessive Ti existing in the grain boundaries to oxygen, and the barrier property of titanium deposited on the upper portion in the subsequent process and hydrogen is further improved. This titanium nitride film 9 is removed by the dry etching method leaving only a portion located in the vicinity of a contact hole opened upwardly of the capacitor upper electrode 6.

Next, in order to make electrical conduction to the source/drain region 17 of the select transistor, a contact hole is formed on the source/drain region 17, and the buffer layer 13, which is a laminate film (TiN/Ti) of titanium and titanium nitride, is deposited by the DC magnetron sputtering method. Subsequently, tungsten is deposited by the CVD method using tungsten hexafluoride ($WF_6$) as a raw material, and thereafter, the tungsten plug 12 is formed by etching back tungsten, titanium nitride and titanium successively from the upper layer. At this time, the upper portion of the preliminarily formed titanium nitride film 9 becomes flush with the upper surface of the second layer insulation film 8.

Further, in order to obtain electrical contact with the lower electrode 4 of the ferroelectric capacitor, a contact hole is formed on the titanium oxide 3 and the lower electrode 4 processed in a linear shape as a drive line (plate line).

Subsequently, in order to connect the upper electrode 6 of the ferroelectric capacitor to the source/drain region 17 of the select transistor and form other interconnection layers of the bit line and the like (not shown, although existing in an identical plane), a laminate film of titanium, titanium nitride, aluminum that contains a trace quantity of silicon and copper and titanium nitride (TiN/AlSiCu/TiN/Ti), which becomes an interconnection layer, is formed by the DC magnetron sputtering method. Then, in order to make the laminate film of titanium nitride have the desired configuration, patterning with a photoresist is carried out by the photolithographic technique, and processing is carried out by the dry etching method to form the interconnection layer 10. Titanium located in the lowermost layer of the interconnection layer 10 operates as a layer of adhesion to the layer insulation film that serves as groundwork. The titanium nitride film located on the film is needed for improving the reliability of interconnection because the film has a melting point higher than that of aluminum and is resistant to disconnection. Moreover, the titanium nitride film located in the uppermost layer of the interconnection layer 10 functions as an antireflection film of aluminum.

The third layer insulation film 11 is further formed on top of the interconnection layer 10, and connection with an interconnection layer is similarly made if the desired portion exists. However, since the electrical connection to the ferroelectric capacitor has been completed in the already formed first interconnection layer 10, it is unusual to form a contact hole in the process after the formation of the first interconnection layer just above or in the vicinity of the ferroelectric capacitor (inside the memory cell).

By applying an electric field having triangular wave form between the upper electrode and the interconnections connected to the lower electrode, to a complex capacitor of a parallel array of 1024 ferroelectric capacitors formed up to the final protective film forming process similarly to the semiconductor device fabricating method of the aforementioned embodiment, a hysteresis loop exhibiting ferroelectricity was obtained. According to this fabricating method, a processing time when a temperature of not lower than 350° C. is maintained at which the reduction due to hydrogen after the formation of the diffusion prevention film is concerned is about one hour in total. This applied triangular wave has a voltage of 3 V and a frequency of 75 Hz. There were the specifications of a saturation polarization value of 22.8 $\mu C/cm^2$ at a voltage of 5 V, a remanence value of 17.5 $\mu C/cm^2$ and a capacitor section leak current density of $6.5 \times 10^{-7}$ A/cm$^2$, and accordingly, ferroelectricity sufficient for use as a ferroelectric capacitor for a storage device was obtained.

On the other hand, with regard to the characteristics of the complex capacitor constructed of 1024 ferroelectric capacitors formed by using the diffusion prevention film obtained by forming an alumina film that has the same film thickness and contains no additive of Group-II element and heat-treating the film at a temperature of 650° C. in an oxygen atmosphere that does not contain carbon dioxide, the polarization value was almost similar to that of the semiconductor storage device of this embodiment, whereas the leak current density was increased to $4.5 \times 10^{-5}$ A/cm$^2$.

In this case, by restraining the processing time when the temperature of not lower than 350° C. is maintained at which the reduction due to hydrogen after the formation of the diffusion prevention film is concerned to about half, the leak current density was able to be restrained similar to that of this invention. However, for example, the flatness of the layer insulation film was significantly degraded, and the processing was impractical because of bad processability.

The operation of a memory device that has the ferroelectric capacitors formed by using the diffusion prevention film obtained by forming an alumina film that has the same film thickness and contains no additive of Group-II element and heat-treating the film at a temperature of 650° C. in an oxygen atmosphere that does not contain carbon dioxide was inspected. As a result, the characteristics of bits are varied with the occurrence of defective bits of several bits to hundreds of bits among 1 Mbits, and only a reduced yield of about 10% was obtained. As a reason for the above, it was discovered that the defective bits occurred as a consequence of the reduced hysteresis loop of the ferroelectric capacitor due to the existence of a portion of degraded hydrogen barrier property according to a microscopic observation of the inside of the alumina as the diffusion prevention film.

It was proved that the capacitor characteristics were improved together with the permeation characteristics by the TDS method by thus using the semiconductor storage device that employed the diffusion prevention film of the embodiment of this invention and the fabricating method therefor. Moreover, according to the semiconductor storage device that employed the diffusion prevention film of the embodiment of this invention, a yield of about 80% was obtained, and it was proved that the hydrogen barrier property was satisfactory according to the microscopic observation of alumina of the diffusion prevention film.

According to the diffusion prevention film 7 of the aforementioned embodiment, by depositing the aluminum oxide film in which the Group-II element of barium is contained and thereafter heat-treating the deposited film in the atmosphere of the mixed gas of oxygen and carbon dioxide, carbon dioxide adsorbs to the Group-II element of barium contained in the aluminum oxide, and the minute grain boundaries of the aluminum oxide are buried. Therefore, the permeation of hydrogen can effectively be restrained, and this allows a diffusion prevention film of excellent hydrogen barrier property to be obtained.

Moreover, since the process of heat-treating the diffusion prevention film is carried out in the atmosphere that contains oxygen and carbon dioxide, the defects can be reduced by not only adsorbing carbon dioxide to the Group-II element of barium added to the aluminum oxide but also sufficiently oxidizing the aluminum oxide at the same time.

Moreover, by covering the aforementioned semiconductor storage device with the diffusion prevention film 7 that is able to effectively restrain the permeation of hydrogen and largely improve the hydrogen barrier property, the characteristic deterioration of the ferroelectric film due to the diffusion of the hydrogen used in the device forming process or the hydrogen generated through reaction or the like can be restrained. Moreover, a capacitor that has a stable satisfactory ferroelectric property can be obtained, and the yield can be improved by decreasing the occurrence of the defectiveness of the semiconductor storage device.

Moreover, according to the aforementioned semiconductor storage device fabricating method, the process of heat-treating the diffusion prevention film 7 is carried out at a temperature of 650° C. However, the adsorption of carbon dioxide to the Group-II element of barium contained in the aluminum oxide of the diffusion prevention film is not sufficient at a temperature lower than 500° C., and the hydrogen barrier property deteriorates at a temperature exceeding 800° C. Therefore, the process of heat-treating the diffusion prevention film should preferably be carried out under the temperature condition of 500° C. to 800° C.

In connection with the aforementioned embodiment, the diffusion prevention film of the ferroelectric memory as a semiconductor storage device that employs the ferroelectric capacitor has been described. However, it is also acceptable to apply the diffusion prevention film of this invention to other semiconductor devices such as a DRAM that employs a high dielectric capacitor and a thin film transistor. It is also acceptable to apply the diffusion prevention film of this invention to devices that need a film with a hydrogen barrier property, such as sensors and actuators that employ a ferroelectric capacitor or a high dielectric capacitor.

Moreover, in the aforementioned embodiment, it is possible to carry out a treatment process under the temperature condition of 350° C. to 450° C. and carry out a treatment process at least under the temperature condition of not lower than 350° C. for three or more minutes after the process of heat-treating the diffusion prevention film. The restriction of temperature in the forming process after the formation of the capacitor and the restriction of time of the high-temperature process are alleviated, and the process arrangement can easily be achieved.

As is apparent from the above, according to the diffusion prevention film and the fabricating method of this invention, the hydrogen barrier property of the diffusion prevention film is remarkably improved. Therefore, the characteristic deterioration and the like of the ferroelectric capacitor or high dielectric capacitor due to the diffusion of the hydrogen used in the device forming process with this diffusion prevention film or the hydrogen generated through reaction or the like can be restrained, and this expands the degree of freedom also with regard to the processing time of the process that needs high temperature treatment and the service condition.

Moreover, according to the semiconductor storage device and the fabricating method of this invention, a capacitor that has a stable satisfactory ferroelectric property (or high dielectric property) can be obtained in the semiconductor storage device provided with the MOS transistor formed on the semiconductor substrate and the capacitor that employs the ferroelectric film or the high dielectric film for the dielectric layer, and the yield can be improved by decreasing the occurrence of defectiveness of the semiconductor storage device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A diffusion prevention film comprised of an oxide of aluminum containing at least one kind of Group-II elements, wherein at least one of carbon dioxide and carbon monoxide adsorbs to said at least one kind of Group-II elements.

2. The diffusion prevention film as claimed in claim 1, wherein
   a principal constituent material of aluminum oxide contains at least one of barium and strontium.

3. A semiconductor storage device provided with a MOS transistor formed on a semiconductor substrate and a capacitor that employs a ferroelectric film or a high dielectric film for a dielectric layer, wherein
   the capacitor is covered with the diffusion prevention film claimed in claim 1.

* * * * *